(12) United States Patent
Miyazawa et al.

(10) Patent No.: US 8,772,052 B2
(45) Date of Patent: Jul. 8, 2014

(54) REPAIRED ORGANIC EL DISPLAY AND METHOD FOR MANUFACTURING SAME INCLUDING REPAIRING PROCESS

(75) Inventors: Kazutoshi Miyazawa, Osaka (JP); Akihisa Nakahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/133,352

(22) PCT Filed: Jan. 21, 2010

(86) PCT No.: PCT/JP2010/000337
§ 371 (c)(1),
(2), (4) Date: Jun. 7, 2011

(87) PCT Pub. No.: WO2010/092749
PCT Pub. Date: Aug. 19, 2010

(65) Prior Publication Data
US 2011/0278603 A1    Nov. 17, 2011

(30) Foreign Application Priority Data

Feb. 10, 2009 (JP) .................................. 2009-028435

(51) Int. Cl.
H01L 21/00 (2006.01)
H01L 27/32 (2006.01)
H01L 51/52 (2006.01)

(52) U.S. Cl.
CPC ......... *H01L 27/3281* (2013.01); *H01L 51/5221* (2013.01); *H01L 2251/568* (2013.01); *Y10S 438/94* (2013.01)
USPC ............................................ 438/4; 438/940

(58) Field of Classification Search
CPC ............ H01L 27/3281; H01L 51/5221; H01L 2251/568
USPC .................................... 438/4, 940
See application file for complete search history.

(56) References Cited

U.S. PATENT DOCUMENTS

| 2002/0142697 | A1  | 10/2002 | Yamagata et al. |
| 2004/0070336 | A1* | 4/2004  | Nagayama .................... 313/506 |
| 2006/0017395 | A1  | 1/2006  | Liao et al. |
| 2006/0028217 | A1  | 2/2006  | Liao et al. |
| 2006/0076555 | A1  | 4/2006  | Liao et al. |
| 2006/0214575 | A1* | 9/2006  | Kajiyama et al. ............. 313/506 |

FOREIGN PATENT DOCUMENTS

| JP | 2001-118684 A | 4/2001 |
| JP | 2001-176672 A | 6/2001 |

(Continued)

OTHER PUBLICATIONS

International Search Report for PCT/JP2010/000337 dated Apr. 27, 2010.

*Primary Examiner* — Kimberly Rizkallah
*Assistant Examiner* — Alexander Belousov
(74) *Attorney, Agent, or Firm* — Pearne & Gordon LLP (57) ABSTRACT

Disclosed is a method for manufacturing an organic EL display, which comprises: a step of preparing an organic EL panel that comprises a substrate and organic EL elements arranged as a matrix on the substrate, wherein each organic EL element has a pixel electrode arranged on the substrate, an organic layer arranged on the pixel electrode, a transparent counter electrode arranged on the organic layer, a protective layer arranged on the transparent counter electrode, and a color filter arranged on the protective layer, and a defect portion present in the organic layer in each organic EL element is detected; a step of destroying a region of the transparent counter electrode positioned above the defect portion by irradiating the region with laser light through the color filter; and a step wherein a region of the color filter positioned above the defect portion is removed.

12 Claims, 9 Drawing Sheets

FOREIGN PATENT DOCUMENTS

| | | | |
|---|---|---|---|
| JP | 2002-260857 A | 9/2002 | |
| JP | 2003-178871 A | 6/2003 | |
| JP | 2004-227852 A | 8/2004 | |
| JP | 2006-278343 A | 10/2006 | |
| JP | 2008-235178 A | 10/2008 | |
| JP | 2008235178 | * 10/2008 | ............. H05B 33/10 |
| JP | 2008281696 | * 11/2008 | ............... G02B 5/20 |
| JP | 2009-016195 A | 1/2009 | |
| KR | WO2008156284 | * 12/2008 | |

* cited by examiner

| Laser wavelength | Color filter's color: red | | Color filter's color: green | | Color filter's color: blue | |
|---|---|---|---|---|---|---|
| 355nm | CF | Intact | CF | Ablated | CF | Ablated |
|  | ITO | Destroyed | ITO | Destroyed | ITO | Intact |
| 532nm | CF | Ablated | CF | Intact | CF | △ |
|  | ITO | Intact | ITO | Destroyed | ITO | △ |
| 1064nm | CF | Intact | CF | Intact | CF | Intact |
|  | ITO | Destroyed | ITO | Destroyed | ITO | Destroyed |

FIG.9

REPAIRED ORGANIC EL DISPLAY AND METHOD FOR MANUFACTURING SAME INCLUDING REPAIRING PROCESS

TECHNICAL FIELD

The present invention relates to an organic EL display and a manufacturing method for the same.

BACKGROUND ART

Recently, organic EL displays have attracted attention as the next-generation flat display panels. The organic EL displays have such advantages as self-luminescence, wide viewing angle, high-contrast image, thin profile, lightweight, and low power consumption.

Each of the organic EL devices that constitute an organic EL display generally includes a pixel electrode, a counter electrode, and an organic layer disposed between the pixel electrode and counter electrode. The organic layer is composed of a light-emitting layer containing fluorescent molecules, and an electron conductive thin film and a hole conductive thin film which sandwich the light-emitting layer. Application of voltage between the counter electrode and the pixel electrode results in the injection of electrons into the electron conductive thin film from the counter electrode and injection of holes into the hole conductive thin film from the pixel electrode, with the result that the electrons and holes are recombined in the light-emitting layer to cause luminescence.

A manufacturing method of an organic EL display includes lamination of organic layers and thin-film electrodes, which are of the order of several tens of nanometers. This lamination process is conducted in a clean room. Nevertheless, it is not possible to completely rid the clean room of foreign material such as particles derived from an organic layer manufacturing machine or other device or from the surrounding environment. Thus, foreign material may be incorporated into the organic layer during manufacture of an organic EL display.

When voltage is applied between the pixel electrode and counter electrode in a state where an organic layer is contaminated with foreign material, it results in current leakage between the electrodes via the foreign material. Current leakage results in low luminous efficiency, leading to high power consumption. Moreover, in a pixel contaminated with foreign material, current leakage via the foreign material reduces the current flow in the organic layer (light-emitting layer) of the pixel. This reduces the overall brightness of the light-emitting layer of the pixel. The presence of pixels contaminated with foreign material causes brightness variation across the organic EL display.

Known techniques for preventing current leakage via foreign material incorporated into the organic layer include laser repair method. The laser repair method is a process whereby current leakage via foreign material is prevented by laser irradiation of a portion of organic layer contaminated with foreign material (hereinafter also referred to as a "defect") (see, e.g., Patent Literatures 1 to 12).

Patent Literature 1 discloses a method in which a laser beam is applied to the pixel electrode of a defective organic EL device having a color filter, so that multi-photon absorption occurs only at the pixel electrode. This allows for selective destruction (insulation) of the pixel electrode in the defect without causing destruction of other components such as a color filter, making it possible to avoid current leakage between the pixel electrode and counter electrode via the defect.

Patent Literatures 2 to 5 disclose a method of preventing current leakage via foreign material by laser ablation of either of a pixel electrode or counter electrode at a defect.

Patent Literature 6 discloses a method of insulating an electrode at a defect by oxidizing the electrode by laser irradiation. Insulation of the defect makes it possible to prevent current leakage via foreign material.

Patent Literatures 7 to 9 disclose a method of preventing current leakage via foreign material by insulating the foreign material itself in the defect by laser irradiation.

Patent Literatures 10 to 12 disclose a laser repair device having a controller and a beam generator. The disclosed laser repair devices are configured to identify the position of a defect present in an organic EL display panel by means of the controller and to irradiate the defect with a laser beam by means of the beam generator for insulating the defect, so that the organic EL display panel can be repaired.

CITATION LIST

Patent Literature

[PTL 1] Japanese Patent Application Laid-Open No. 2008-235178
[PTL 2] Japanese Patent Application Laid-Open No. 2009-16195
[PTL 3] Japanese Patent Application Laid-Open No. 2001-176672
[PTL 4] Japanese Patent Application Laid-Open No. 2006-278343
[PTL 5] U.S. Patent Application Publication No. 2004/0070336
[PTL 6] Japanese Patent Application Laid-Open No. 2002-260857
[PTL 7] Japanese Patent Application Laid-Open No. 2004-227852
[PTL 8] Japanese Patent Application Laid-Open No. 2003-178871
[PTL 9] U.S. Patent Application Publication No. 2002/0142697
[PTL 10] U.S. Patent Application Publication No. 2006/0017395
[PTL 11] U.S. Patent Application Publication No. 2006/0028217
[PTL 12] U.S. Patent Application Publication No. 2006/0076555

SUMMARY OF INVENTION

Technical Problem

However, there is concern that the organic EL display shows poor image quality if the difference in brightness between a defect (non-luminescent region), a dark spot, and a luminescent region is large. In particular, the inventor found that the brightness difference between a defect (non-luminescent region) and a luminescent region becomes large where a color filter is left directly above the defect.

It is therefore an object of the present invention to provide a manufacturing method of an organic EL display that shows limited brightness reduction at defects.

Solution to Problem

The inventor found that brightness reduction at a defect (non-luminescent region) can be prevented by the removal of a portion of color filter directly above the defect. With additional studies, the inventor completed the present invention. That is, a first aspect of the present invention concerns manufacturing methods of an organic EL display given below.

[1] A method of manufacturing an organic EL display, including:

providing an organic EL panel including a substrate and organic EL devices disposed over the substrate in a matrix arrangement, the organic EL devices each including a pixel electrode disposed over the substrate, an organic layer disposed over the pixel electrode, a transparent counter electrode disposed over the organic layer, a protective layer disposed over the transparent counter electrode, and a color filter disposed over the protective layer;

detecting a defect present in the organic layer of each of the organic EL devices;

destroying a portion of the transparent counter electrode directly above the defect by applying a laser beam to the portion through the color filter; and removing a portion of the color filter directly above the defect.

[2] The manufacturing method according to [1], wherein the laser beam has a wavelength of 400 nm or less.

[3] The manufacturing method according to [1] or [2], wherein the step of removing the color filter and the step of destroying the transparent counter electrode are the same step.

[4] The manufacturing method according to [1] or [2], wherein the step of removing the color filter and the step of destroying the transparent counter electrode are different steps, and the removal of the color filter is accomplished by applying a laser beam to a portion of the color filter directly above the defect.

[5] The manufacturing method according to any one of [1] to [4], wherein a through-hole is formed in the color filter in the step of removing the color filter.

[6] The manufacturing method according to any one of [1] to [4], wherein the color filter is thinned in the step of removing the color filter.

[7] The manufacturing method according to any one of [1] to [6], wherein fine gas bubbles are formed in the protective layer by laser irradiation.

A second aspect of the present invention concerns an organic EL display given below.

[8] An organic EL display including:

a substrate; and organic EL devices disposed over the substrate in a matrix arrangement, the organic EL devices each including a pixel electrode disposed over the substrate, an organic layer disposed over the pixel electrode, a transparent counter electrode disposed over the organic layer, a protective layer disposed over the transparent counter electrode, and a color filter disposed over the protective layer, wherein at least one of the organic EL devices has a defect in the organic layer, a portion of the transparent counter electrode directly above the defect is destroyed, and a portion of the color filter directly above the defect is removed.

Advantageous Effects of Invention

With the manufacturing method of organic EL display of the present invention, it is possible to prevent brightness reduction in a non-luminescent region because a portion of a color filter directly above the non-luminescent region is also ablated, thus preventing brightness variation across the organic EL display (later described).

DESCRIPTION OF EMBODIMENTS

1. Manufacturing Method of Organic EL Display

A manufacturing method of organic EL display of the present invention includes: 1) a first step of providing an organic EL panel; 2) a second step of detecting a defect in an organic layer of organic EL devices that constitute an organic EL panel; and 3) a third step of destroying a portion of a transparent counter electrode directly above the defect by laser irradiation through a color filter. Each step will be described in detail below.

1) In the first step, an organic EL panel is provided. The organic EL panel provided in the first step is of the top-emission type. The organic EL panel includes a substrate and organic EL devices disposed over the substrate in a matrix arrangement. Each organic EL device includes a pixel electrode disposed over the substrate, an organic layer disposed over the pixel electrode, a transparent counter electrode disposed over the organic layer, a protective layer disposed over the transparent counter electrode, and a color filter disposed over the protective layer.

The present invention's effects are exerted particularly when manufacturing a large-screen organic EL display; since it is likely that foreign material like particles is incorporated into the organic layer during manufacture of a large-screen organic EL display, it is highly necessary to prevent possible current leakage via the defect by means of the method of the present invention.

The organic layer of the organic EL device may be formed either by vapor deposition or by coating method. For the purpose of achieving a large-screen organic EL display, the organic layers are preferably formed by the coating method. Examples of coating methods include inkjet printing, dispensing, nozzle coating, spin coating, intaglio printing, and relief printing. On the other hand, when vapor deposition is employed, there is concern that foreign material such as particles derived from a metal mask may be incorporated in the organic layer. Thus, even when vapor deposition is employed, it is effective to prevent current leakage via defects by means of the method of the present invention.

An organic EL device contained in an organic EL panel is manufactured by lamination of thin electrode films and thin organic layer films. Manufacturing of an organic EL device requires a film thickness control of the order of several tens of nanometers. Although it is typical that the manufacturing environment is well managed and manufacturing equipment is well maintained for manufacture, unwanted foreign material may be incorporated into the organic layer during manufacture (see FIGS. 3A and 3B).

The following second step and third step are directed to a method by which current leakage via a region of organic layer contaminated with such foreign material (hereinafter also referred to as a "defect") is prevented.

Figure 3A:
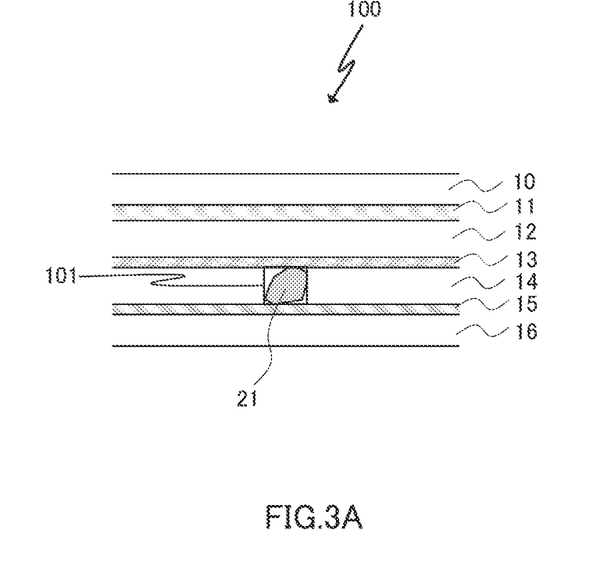
FIGS. 3A and 3B are sectional views of an organic EL device in an organic EL display of the present invention.
Figure 3B:
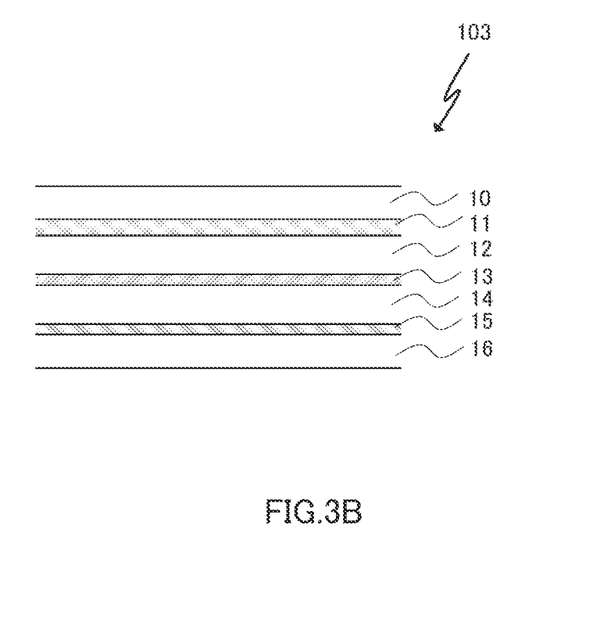

2) In the second step, organic EL devices are checked for the presence of a defect, a region of the organic layer contaminated with foreign material such as a particle (see FIGS. 3A and 3B). There are no particular limitations on the defect detection method; examples include visual inspection, and detection of leak light generated as a result of application of a reverse bias voltage or a forward bias voltage to the organic EL display.

3) In the third step, a portion of a transparent counter electrode directly above a defect which has been identified in the second step is destroyed by applying a laser beam through a color filter (hereinafter may simply referred to as "destroy a transparent counter electrode"). As used herein, "a laser beam is applied to a transparent counter electrode" means to focus a laser beam onto a transparent counter electrode. As used herein, "destroy a transparent counter electrode" means to destroy the function of a transparent counter electrode, i.e., to impede current flow through the electrode.

Figure 1A:
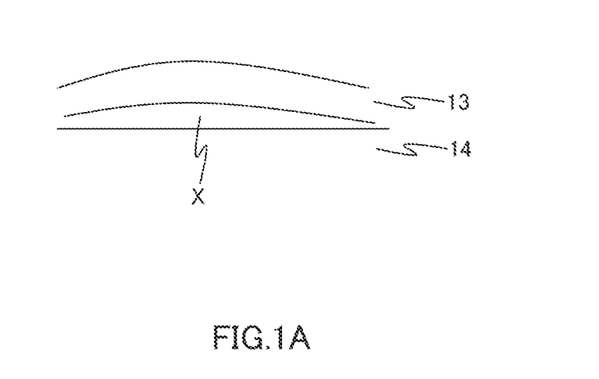
FIGS. 1A to 1C illustrate a transparent counter electrode destroyed by laser irradiation.
Figure 1B:
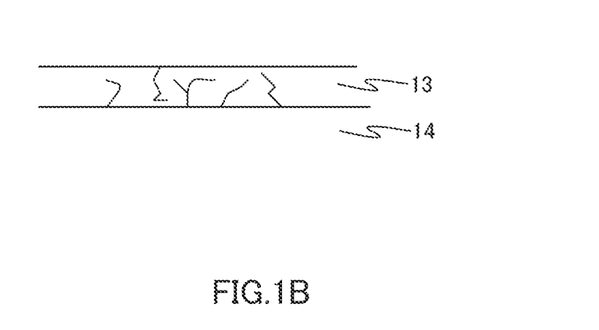
Figure 1C:
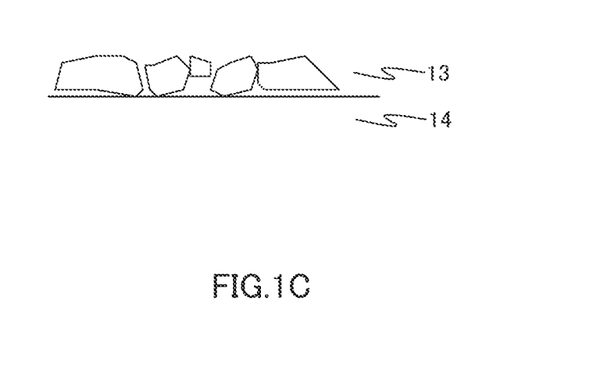

FIGS. 1A to 1C illustrate a transparent counter electrode destroyed by laser irradiation. In the drawings, reference sign 13 represents a transparent counter electrode, and reference sign 14 represents an organic layer. As seen from FIGS. 1A to 1C, the expression "destroy a transparent counter electrode" means to impede current flow through a laser-irradiated portion of transparent counter electrode 13 via a defect either by 1) forming space X between the laser-irradiated portion of transparent counter electrode 13 and organic layer 14 (FIG. 1A), 2) degenerating the laser-irradiated portion of transparent counter electrode 13 to create a crack FIG. 1B), or 3) crashing the laser-irradiated portion of transparent counter electrode 13 (FIG. 1C).

In addition, in the present invention, a protective layer is disposed over the transparent counter electrode. Thus, when the transparent counter electrode has been destroyed, scattering of pieces of the transparent counter electrode does not occur. Thus, in the present invention, pieces of a destroyed transparent counter electrode never contribute to creation of additional defects in the organic EL display.

By destroying a portion of the transparent counter electrode directly above a defect in this way, it is possible to prevent possible current leakage via the defect. Although the defect creates a non-luminescent region, the organic EL device's function can be restored.

The laser-irradiation region of the transparent counter electrode is preferably larger than the defect by 20 to 50%. The area of the laser-irradiation region can be adjusted by means of a slit member attached to a laser source. A slit member refers to a member for freely changing the laser spot size in vertical and horizontal directions. The usage of a slit member allows for defect-size dependent adjustment of the area of a laser-irradiation region.

There are no particular limitations on the laser source used for laser irradiation; examples include flash lamp-pumped Nd:YAG laser. When an Nd:YAG laser is employed, the wavelength of a laser beam can be selected from 1,064 nm (fundamental), 532 nm (second harmonics), 355 nm (third harmonics), and 266 nm (fourth harmonics) wavelengths.

There are also no particular limitations on the wavelength of a laser beam applied to a transparent counter electrode; it is preferably 1,100 nm or less, most preferably 400 nm or less. That is, in the case of Nd:YAG laser, the third or fourth harmonics wavelength may be employed. This is because laser beams of 400 nm wavelength or less have less influence on the organic layer disposed below the transparent counter electrode.

The energy (energy density) of a laser beam on the transparent counter electrode is determined depending on the material or thickness of the transparent counter electrode. For example, in the case where a transparent counter electrode (material: ITO, thickness: 100 nm) is to be destroyed with Nd:YAG laser, it is preferable to employ, when influences of laser irradiation on the color filter (later described) are not considered, the third harmonics wavelength (355 nm) while setting the energy density at 0.05 to 0.15 J/cm$^2$.

Thus, with the manufacturing method of the present invention, a portion of the transparent counter electrode directly above a defect is selectively destroyed so as to prevent current leakage via the defect, making it possible to repair an organic EL device without damaging the organic layer, TFT and other components.

The manufacturing method of the present invention is characterized in that the method further includes a step of ablating a portion of a color filter directly above a defect in an organic layer, which defect has been detected in the second step (hereinafter may simply referred to as "ablate a color filter"). The step of ablating a color filter (hereinafter may simply referred to as a "filter ablation step") may be the same step as the third step described above (see Embodiment 1) or may be a different step from the third step (see Embodiments 2 and 3).

When the filter ablation step is the same step as the third step, by laser irradiation, a color filter is ablated simultaneously with the destruction of a transparent counter electrode.

On the other hand, when the filter ablation step and third step are different steps, filter ablation in the filter ablation step is accomplished by laser irradiation of a portion of the color filter directly above a defect. Moreover, when the filter ablation step and third step are different steps, the filter ablation step may be conducted either before or after the third step, but preferably conducted before the third step. As used herein, "laser beam is applied to a color filter" means to focus a laser beam on a color filter.

As used herein, "ablate a color filter" may mean either to completely ablate the laser-irradiated region of a color filter to form a through-hole therein (see Embodiments 1 and 2), or to partially ablate the surface of the laser-irradiated region of a color filter for thinning (see Embodiment 3).

Thinning of a color filter may be accomplished for instance by employing a laser beam wavelength that easily passes through the color filter more easily than those used for forming a through-hole, or by reducing the energy density of laser beam to a level smaller than that of the laser beam used for forming a through-hole.

The laser irradiation area on the color filter is preferably larger than a defect by 30 to 60%.

Thus, with the manufacturing method of the present invention, it is possible to prevent brightness reduction at a defect (non-luminescent region) by ablating a region of a color filter directly above the defect. The correlation between color filter ablation and prevention of brightness reduction in non-luminescent regions will be described in detail later in the section titled [2. Organic EL Display].

The wavelength of a laser beam applied to a transparent counter electrode in the third step varies depending on whether the filter ablation step is the same step as the third step (see Embodiment 1), or the filter ablation step is a different step from the third step (see Embodiments 2 and 3). Hereinafter, wavelengths of a laser beam applied to a transparent counter electrode will be described for each case.

Case 1 (Filter Ablation Step is the Same Step as Third Step)

In this case, the laser beam applied to a transparent counter electrode preferably also has a component that does not pass through the color filter. This is because when the filter ablation step is the same step as the third step, a part of the laser beam applied to the transparent counter electrode needs to be absorbed by the color filter.

Color filters show different light transmittance depending on their color. For example, a red color filter shows high light transmittance at 600 nm or greater; a green color filter shows high light transmittance between 480 nm and 580 nm and at 790 nm or greater; and a blue color filter shows high light transmittance between 430 nm and 500 nm and at 850 nm or greater. Thus, when the color filter directly above a defect is red, the laser beam's wavelength may be set to less than 600 nm; when the color filter directly above a defect is green, the laser beam's wavelength may be set to less than 480 nm or between greater than 580 nm and less than 790 nm; and when the color filter directly above a defect is blue, the laser beam wavelength may be set to less than 430 nm or between greater than 500 nm and less than 850 nm.

Case 2 (Filter Ablation Step and Third Step are Different Steps)

In this case, the laser beam's wavelength further varies depending on whether (i) a color filter is present directly above a laser-irradiation region of a transparent counter electrode (see Embodiment 3), or (ii) a color filter is not present directly above a laser-irradiation region of a transparent counter electrode (see Embodiment 2). For example, when the third step is conducted before the filter ablation step or when thinning of a color filter in the filter ablation step is followed by the third step, a color filter is present directly above a laser-irradiation region of a transparent counter electrode (case (i)). On the other hand, for example, when formation of a through-hole in a color filter in the filter ablation step is followed by the third step, no color filter is present directly above a laser-irradiation region of a transparent counter electrode (case (ii)).

Case (i) where Color Filter is Present Directly Above a Laser-Irradiation Region of Transparent Counter Electrode In this case, the laser beam to be applied preferably has a wavelength that passes through a color filter, because the transparent counter electrode needs to be destroyed without affecting the color filter. Thus, when the color filter directly above a defect is red, the laser beam's wavelength may be set to 600 nm or greater; when the color filter directly above a defect is green, the laser beam's wavelength may be set between 480 nm and 580 nm or 790 nm or greater; and when the color filter directly above a defect is blue, the laser beam's wavelength may be set between 430 nm and 500 nm or 850 nm or greater.

Case (ii) where No Color Filter is Present Directly Above a Laser-Irradiation Region of Transparent Counter Electrode In this case, any desired wavelength can be employed because there is no need to consider influences of laser irradiation on the color filter. The laser beam's wavelength is preferably set to 400 nm or less—a wavelength range where a laser beam has less influence on the organic layer.

Thus, with the manufacturing method of the present invention, defects can be made non-luminescent without damaging the organic layer, achieving low power consumption and high luminous efficiency. Moreover, since a color filter directly above a defect is ablated, it results in brightness elevation in the non-luminescent region. It is thus possible to reduce brightness variation across the organic EL display.

2. Organic EL Display

An organic EL display of the present invention is manufactured by the above-described manufacturing method of the present invention. The organic EL display of the present invention is of the top-emission type, and includes a substrate and organic EL devices disposed over the substrate in a matrix arrangement.

Each organic EL device includes a pixel electrode disposed over the substrate, an organic layer disposed over the pixel electrode, a transparent counter electrode disposed over the organic layer, a protective layer disposed over the transparent counter electrode, and a color filter disposed over the protective layer. Optionally, sealing glass may be disposed over the color filter.

The substrate is an insulating plate. The substrate may incorporate therein thin-film transistor (TFTs.)

The pixel electrode is an electrically conductive member disposed over the substrate. The pixel electrode generally serves as an anode, but may serve as a cathode. The pixel electrode preferably has light reflectivity. Examples of materials of the pixel electrode include APC alloys (silver-palladium-copper alloys), ARA alloys (silver-ruthenium-gold alloys), MoCr alloys (molybdenum/chrome alloys), and NiCr alloys (nickel/chrome alloys). The pixel electrode may be connected to the drain electrode or source electrode of a TFT through a contact hole.

The organic layer includes an organic light-emitting layer containing organic luminescent material. Organic luminescent material contained in the organic light-emitting layer is preferably polymeric organic luminescent material so that the layer can be formed by coating methods. Examples of polymeric organic luminescent material include polyphenylenevinylene and its derivatives, polyacetylene and its derivatives, polyphenylene and its derivatives, poly para phenylene ethylene and its derivatives, poly(3-hexylthiophene) and its derivatives, and polyfluorene and its derivatives.

The organic luminescent layer emits red, green or blue light depending on the position of the organic EL device. The organic layer may further include a hole injection layer, a hole transport layer, an electron transport layer, and the like.

The transparent counter electrode is a transparent electrically conductive member disposed over the organic layer. The counter electrode generally serves as a cathode, but may also serve as an anode. Examples of materials of the transparent counter electrode include ITO and IZO. The transparent counter electrode is about 100 nm in thickness. The organic EL display of the present invention is characterized in that portions of the transparent counter electrode directly above defects in the organic layer are selectively destroyed.

The protective layer is a member for protecting the organic layer against water and oxygen. Examples of materials of the protective layer include inorganic materials such as silicon nitrides (SiNx) and organic materials such as UV curable resins.

The color of the color filter is appropriately determined depending on the color of light which an organic EL device emits. More specifically, an organic EL device for emitting red light includes a red color filter; an organic EL device for emitting green light includes a green color filter; and an organic EL device for emitting blue light includes a blue color filter. Examples of materials of the color filter include color resists. The color filter is about 1 μm in thickness. The organic EL display of the present invention is characterized in that a portion of a color filter directly above a defect in an organic layer is selectively ablated.

As described above, in the organic EL display of the present invention, a portion of a color filter directly above a defect is selectively ablated, so that brightness reduction at the defect (non-luminescent region) is prevented. With reference to the accompanying drawings, the following describes how color filter ablation is correlated with prevention of brightness reduction in the non-luminescent region.

Figure 2:
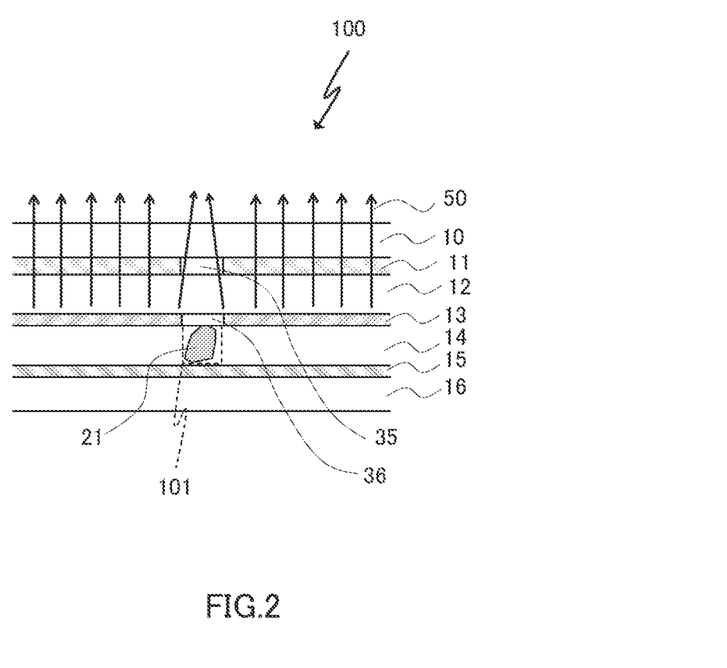
FIG. 2 illustrates a luminescent state of an organic EL display of the present invention.

FIG. 2 illustrates organic EL device 100 having a defect, which is contained in the organic EL display of the present invention. In organic EL device 100, a portion of the transparent counter electrode directly above a defect is destroyed, and a portion of the color filter directly above the defect is ablated. Organic EL device 100 includes substrate 16, pixel electrode 15, organic layer 14, transparent counter electrode 13, protective layer 12, color filter 11, and sealing glass 10.

Foreign material 21 is incorporated into organic layer 14. The region of organic layer 14 contaminated with foreign material 21 constitutes defect 101. Arrows 50 in FIG. 2 represent beams of light emitted from organic layer 14.

Since defect 101 is a non-luminescent region as described above, defect 101 does not emit light as illustrated in FIG. 2. However, beams of light emitted from the surrounding region of defect 101 in organic layer 14 diffuse over defect 101. Thus, light can also be taken out from defect 101, a non-luminescent region. Moreover, in the present invention, a portion of color filter 11 directly above defect 101 is ablated and, therefore, beams of light diffused over defect 101 do not pass through color filter 11. With this configuration, the beams of light diffused over defect 101 travel to the outside without being attenuated by color filter 11. Thus, even if defect 101 becomes a non-luminescent region, beams of light emitted from the surrounding region of defect 101 in organic layer 14 and diffused over defect 101 can be taken out without being attenuated, whereby brightness reduction at defect 101 can be prevented.

Hereinafter, embodiments of the manufacturing method of organic EL display of the present invention will be described with reference to the accompanying drawings. The following embodiments are directed to a third step (a step of destroying a transparent counter electrode) and a color filter ablation step, which are conducted after a second step of detecting a defect in the organic layer of an organic EL device.

Embodiment 1

Embodiment 1 describes a case where the third step and the color filter ablation step (filter ablation step) are the same step.

FIG. 3A illustrates organic EL device 100 having a defect detected in the second step (step of detecting a defect in the organic layer of an organic EL device) of the manufacturing method of the present invention.

Organic EL device 100 of FIG. 3A includes substrate 16, pixel electrode 15, organic layer 14, transparent counter electrode 13, protective layer 12, color filter 11, and sealing glass 10. Organic layer 14 has foreign material 21, and the region of organic layer 14 contaminated with foreign material 21 constitutes defect 101.

On the other hand, the organic EL display of the present invention also includes organic EL device 103 free of any defect, such as that illustrated in FIG. 3B.

Figure 4:
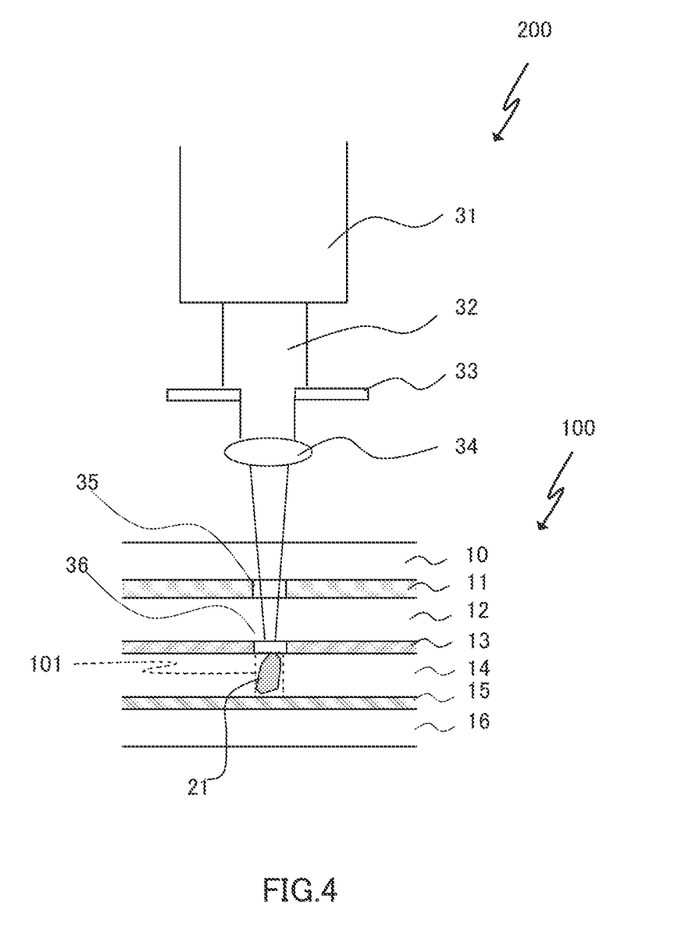
FIG. 4 illustrates a part of a manufacturing method according to Embodiment 1.

FIG. 4 illustrates a third step and a filter ablation step according to Embodiment 1. As illustrated in FIG. 4, laser device 200 used in the third step and filter ablation step includes laser source 31, slit member 33, and focus lens 34.

As illustrated in FIG. 4, in the third step according to this embodiment, laser beam 32 is focused onto transparent counter electrode 13 through color filter 11 at a position directly above defect 101.

The wavelength and energy density of laser beam 32 may be adjusted such that destruction of transparent counter electrode 13 and ablation of color filter 11 are effected at the same time when laser beam 32 is focused onto transparent counter electrode 13.

For example, in the case where flash lamp-pumped Nd:YAG laser is employed as laser source 31, when color filter 11 is red, the wavelength of laser beam 32 may be set to 532 nm (second harmonics) while setting the laser energy density on transparent counter electrode 13 greater than 0.7 $J/cm^2$; when color filter 11 is green, the wavelength of laser beam 32 may be set to 355 nm (third harmonics) while setting the laser energy density on transparent counter electrode 13 to 0.41 $J/cm^2$ or greater; and when color filter 11 is blue, the wavelength of laser beam 32 may be set to 355 nm while setting the laser energy density on transparent counter electrode 13 greater than 0.41 $J/cm^2$, or the wavelength of laser beam 32 may be set to 532 nm while setting the laser energy density on transparent counter electrode 13 to 0.63 $J/cm^2$ or greater.

Focusing laser beam 32 onto transparent counter electrode 12 results in the formation of through-hole 35 in color filter 11, so that destroyed portion 36 is formed in transparent counter electrode 12.

As described above, in this embodiment, it is possible to prevent current leakage via a defect by destroying a portion of the transparent counter electrode directly above the defect. Thus, it is possible to repair an organic EL device without damaging its organic layer, TFT, and other components. Moreover, by ablating a portion of the color filter directly above the defect, it is possible to prevent brightness reduction at the defect (non-luminescent region), making it possible to manufacture an organic EL display free of brightness variation. Further, in this embodiment, since color filter ablation and transparent counter electrode destruction can be effected in one step, an organic EL device can be repaired in shorter time.

Embodiment 2

Embodiment 1 describes a case where the third step and filter ablation step are the same step. Embodiment 2 describes a case where the third step and filter ablation step are different steps.

Figure 5A:
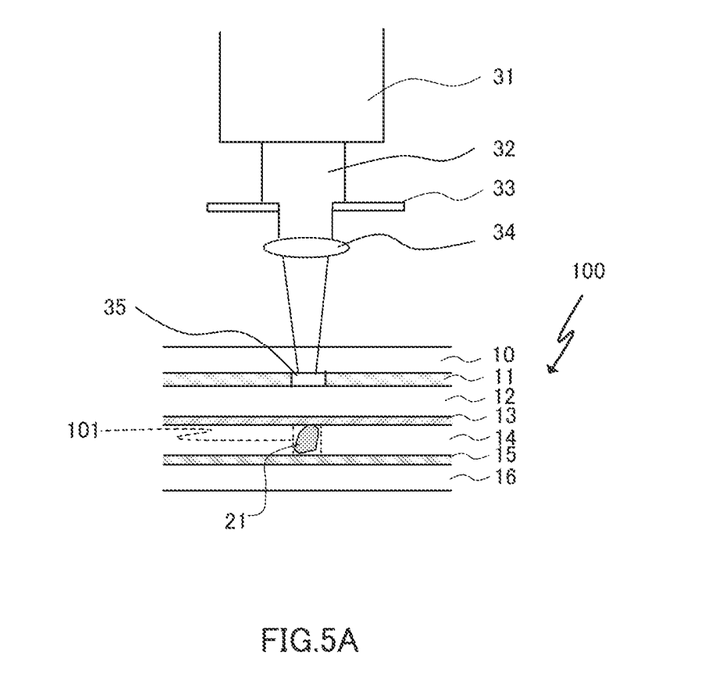
FIGS. 5A and 5B illustrate a part of a manufacturing method according to Embodiment 2.
Figure 5B:
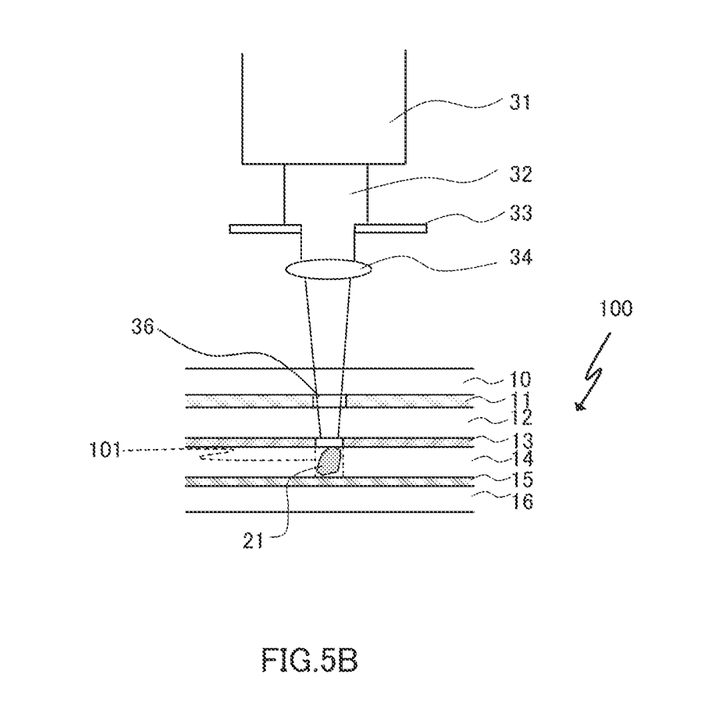

FIG. 5A illustrates a filter ablation step according to Embodiment 2. FIG. 5B illustrates a third step according to Embodiment 2.

As illustrated in FIG. 5A, in the filter ablation step according to this embodiment, laser beam 32 is first focused onto a portion of color filter 11 directly above defect 101, ablating the irradiated portion of color filter 11 to form through-hole 35. Laser beam 32 with a specific wavelength that cannot pass through color filter 11 is focused onto color filter 11.

For example, in the case where flash lamp-pumped Nd:YAG laser is employed as laser source 31, when color filter 11 is red, the wavelength of laser beam 32 may be set to 532 nm (second harmonics) while setting the laser energy density on color filter 11 to 0.48 $J/cm^2$ or greater, or the wavelength of laser beam 32 may be set to 355 nm (third harmonics) while setting the laser energy density on color filter 11 to 0.32 $J/cm^2$ or greater; when color filter 11 is green, the wavelength of laser beam 32 may be set to 355 nm (third harmonics) while setting the laser energy density on color filter 11 to 0.32 $J/cm^2$ or greater; and when color filter 11 is blue, the wavelength of laser beam 32 may be set to 532 nm (second harmonics) while setting the laser energy density on color filter 11 to 0.48 $J/cm^2$ or greater, or the wavelength of laser beam 32 may be set to 355 nm (third harmonics) while setting the laser energy density on color filter 11 to 0.13 J/cm² or greater.

Subsequently, in the third step, laser beam 32 is focused onto a portion of transparent counter electrode 13 directly above defect 101, destroying transparent counter electrode 13 (FIG. 5B). Unlike Embodiment 1, in the third step according to this embodiment, it is possible to make the laser irradiation condition more suitable for the destruction of transparent counter electrode 13 because color filter 11 has been ablated and therefore there is no need to consider influences of laser beam irradiation on color filter 11. For example, in the case where flash lamp-pumped Nd:YAG laser is employed as laser source 31, the wavelength of laser beam 32 may be set to 355 nm while setting the laser energy density on transparent counter electrode 13 to 0.05 to 0.15 J/cm².

When conducting color filter ablation and transparent counter electrode destruction in one step as in Embodiment 1, there is concern that a larger area of color filter is ablated. When the ablated area of color filter is too large with respect to the non-luminescent region, it results in the elevation of the proportion of light that does not pass through the color filter. This may affect the color reproducibility of the organic EL display. By contrast, when conducting color filter ablation and transparent counter electrode destruction in different steps as in this embodiment, the ablation area of color filter can be readily adjusted as desired. Accordingly, in this embodiment, it is possible to avoid influences on color reproducibility.

Embodiment 3

Embodiments 1 and 2 both describe a case where a laser-irradiated portion of a color filter is completely ablated to form a through-hole therein. Embodiment 3 describes a case where a laser-irradiated portion of a color filter is not completely ablated.

Figure 6A:
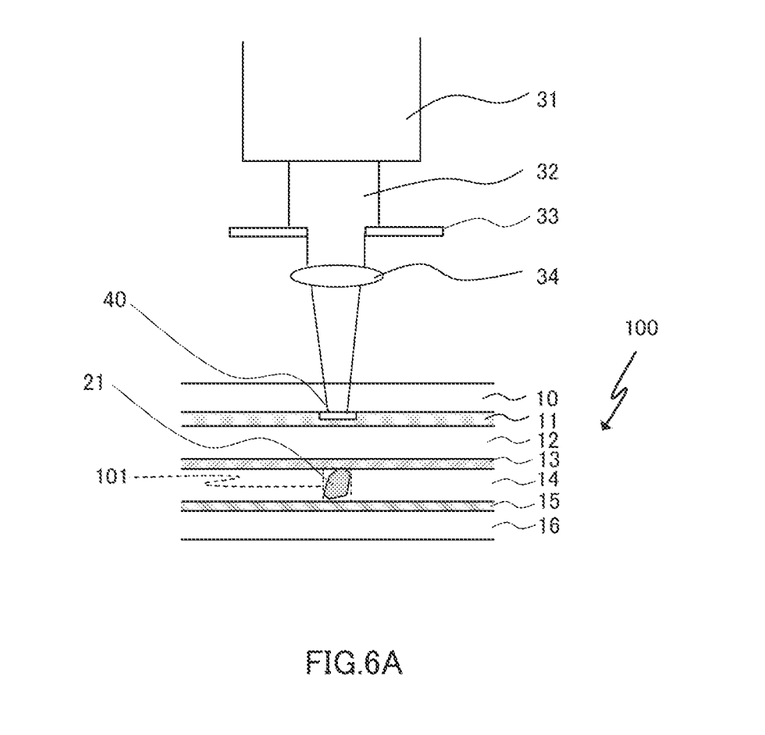
FIGS. 6A and 6B illustrate a part of a manufacturing method according to Embodiment 3.
Figure 6B:
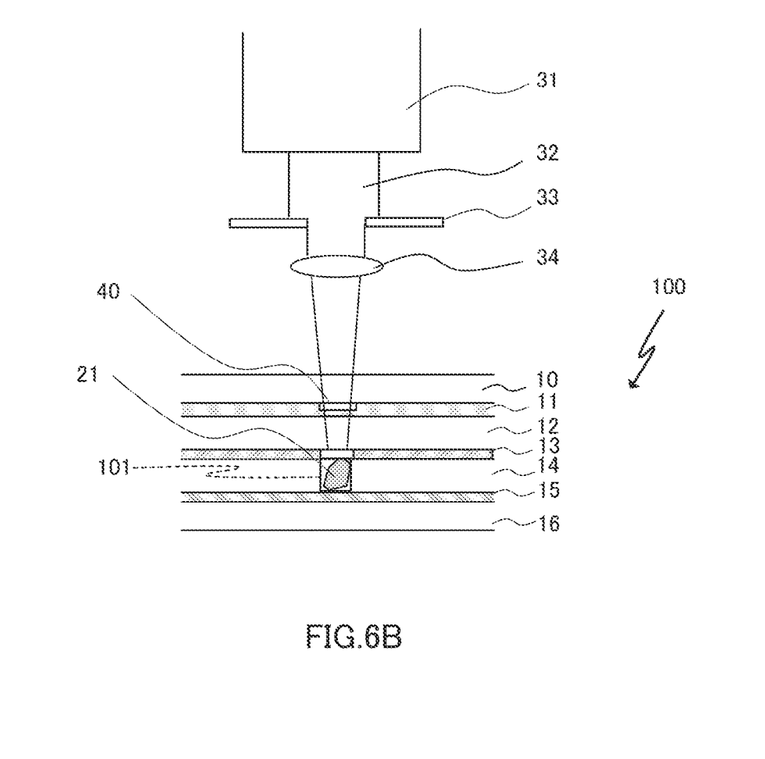

FIG. 6A illustrates a filter ablation step according to Embodiment 3. FIG. 6B illustrates a third step according to Embodiment 3.

As illustrated in FIG. 6A, in the filter ablation step according to this embodiment, laser beam 32 is first focused onto a portion of color filter 11 directly above defect 101, ablating the surface of the laser-irradiated portion of color filter 11 for thinning region 40 of color filter 11. This embodiment is characterized in that the wavelength or energy density of laser beam 32 is adjusted such that the laser-irradiated portion of color filter 11 is not completely ablated.

Subsequently, in the third step, laser beam 32 is focused onto a portion of transparent counter electrode 13 directly above defect 101, destroying transparent counter electrode 13 (FIG. 6B). The third step according to this embodiment is characterized in that laser beam 32 is adjusted such that color filter 11, which has been thinned in the filter ablation step, is not further ablated. Thus, the wavelength of laser beam 32 in the third step is adjusted such that it passes through color filter 11. For example, in the case where flash lamp-pumped Nd:YAG laser is employed as laser source 31, the wavelength of laser beam 32 may be set to 1,064 nm (fundamental) while setting the laser energy density on transparent counter electrode 13 to 0.42 J/cm² or less.

As described above, since a thin color filter is left directly above a defect in this embodiment, it is possible to prevent reduction in color reproducibility while attaining the effect of Embodiment 1.

Embodiment 4

Embodiment 4 describes a case where material that generates fine gas bubbles by irradiation with laser beam 32 or UV light is used for a protective layer.

Figure 7:
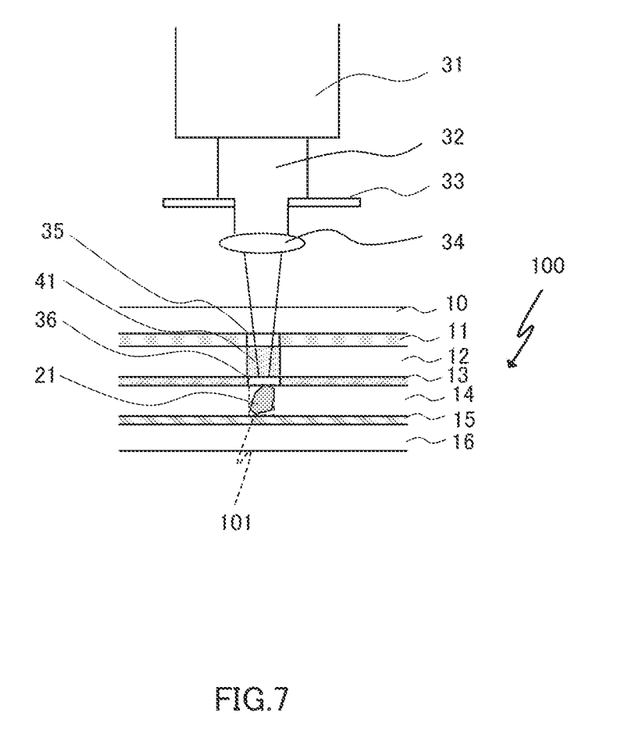
FIG. 7 illustrates a part of a manufacturing method according to Embodiment 4.

FIG. 7 illustrates a third step and a filter ablation step according to Embodiment 4.

As illustrated in FIG. 7, in this embodiment, laser beam 32 is focused onto a portion of transparent counter electrode 103 directly above defect 101, ablating a portion of color filter directly above defect 101 and destroying the portion of transparent counter electrode 103 directly above defect 101.

The wavelength and energy density of laser beam 32 may be adjusted such that destruction of transparent counter electrode 103 and ablation of color filter 11 are effected at the same time when laser beam 32 is focused onto transparent counter electrode 103.

At this time, laser beam 32 passes through protective layer 12 disposed between color filter 11 and transparent counter electrode 13. When laser beam 32 passes through protective layer 12, fine gas bubbles 41 are generated in protective layer 12. Fine gas bubbles 41 generated in protective layer 12 scatter light that are travelling around defect 101 and thereby improves brightness at defect 101.

This embodiment describes a case where material that generates fine gas bubbles by irradiation with laser beam 32 or UV light is used for a protective layer. In stead of this material, for example, material that changes its optical refractive index by irradiation with laser beam 32 or UV light may be used for the protective layer.

As described above, in this embodiment, it is possible to enhance brightness at defects while attaining the effect of Embodiment 1, whereby an organic EL display with lesser brightness variation can be manufactured.

EXAMPLES

Hereinafter, Examples of the present invention will be described, which however shall not be construed as limiting the scope of the invention thereto.

Example 1

Provision of Organic EL Device

Figure 8:
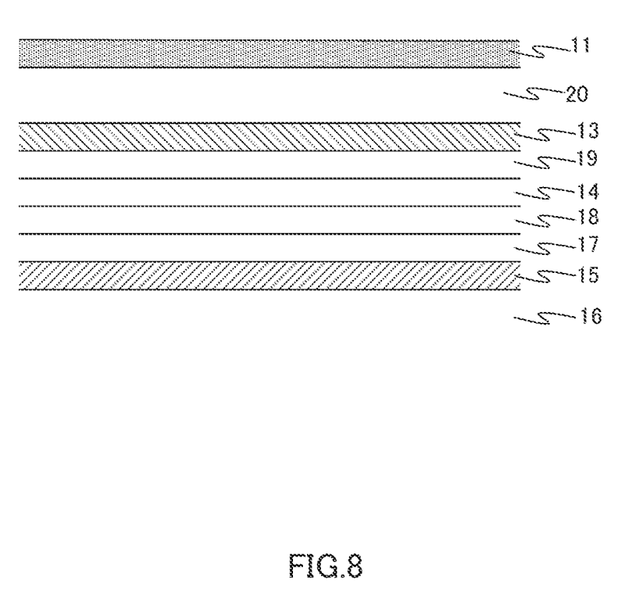
FIG. 8 illustrates an organic EL device prepared in Examples.

Organic EL devices such as that illustrated in FIG. 8 are provided. In each organic EL device, pixel electrode 15, hole injection layer 17, hole transport layer 18, organic light-emitting layer 14, electron transport layer 19, and 100 nm-thick transparent counter electrode 13 (ITO electrode) are sequentially laminated on glass substrate 16. On each organic EL device, glass plate 20 and a red, green or blue color filter 11 are disposed. In this way, three types of organic EL devices are provided, which have color filters of different colors. Examples of materials of color filter 100 include color resists. The thickness of the color filter is set to 1 μm.

Laser Irradiation

The transparent counter electrode of each of the organic EL devices provided above is irradiated with a laser beam of 1,064 nm wavelength at an energy density of 0.42 to 4.5 J/cm², a laser beam of 532 nm wavelength at an energy density of 0.06 to 0.71 J/cm², and a laser beam of 355 nm wavelength at an energy density of 0.05 to 0.41 J/cm². AGT-2000RT (YAG laser, manufactured by AGT Corporation) is employed as a laser device. The spot size of the laser beam on the transparent counter electrode is set to 20 μm, and pulse width is set to 3 to 5 ns. Laser irradiation is done in a single shot.

Figure 9:
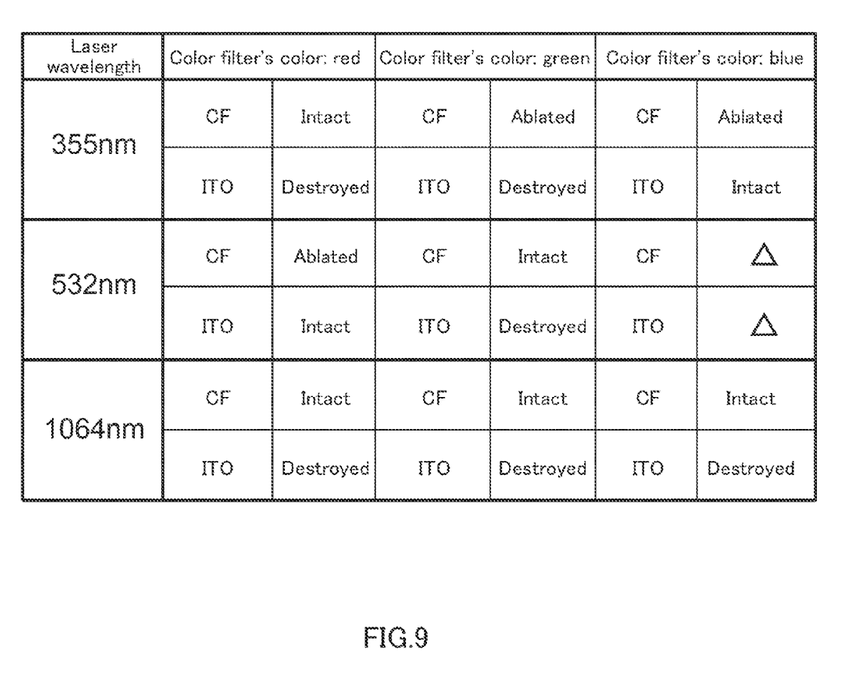
FIG. 9 is a table showing results of Example 1.

FIG. 9 is a table that lists results of laser irradiation on the color filters (CF) and transparent counter electrodes (ITO electrodes).

As seen from FIG. 9, all laser irradiations using 1,064 nm wavelength (laser energy density: 0.42 J/cm$^2$) succeed in selectively destroying the transparent counter electrode without affecting the color filter.

Laser irradiation using 532 nm wavelength (laser energy density: 0.63 J/cm$^2$) succeeds in ablating the red color filter; when the laser energy density is set to 0.56 J/cm$^2$ or greater, it also succeeds in ablating the blue color filter. However, the green color filter is not affected by the laser irradiation. In the case of the red color filter, laser irradiation using 532 nm fails to sufficiently destroy the ITO electrode. This is considered to be due to attenuation of the energy of the laser beam of 532 nm wavelength as a result of absorption by the red color filter. Thus, when the color filter is red and a laser beam of 532 nm wavelength is used for destroying the ITO electrode, the laser energy density needs to be increased to greater than 0.63 J/cm$^2$.

Laser irradiation using 355 nm (laser energy density: 0.25 J/cm$^2$) succeeds in ablating the blue color filter; when the laser energy density is set to 0.41 J/cm$^2$ or greater, it also succeeds in ablating the green color filter. However, the red color filter is not affected by the laser irradiation. In the case of the blue color filter, laser irradiation using 355 nm wavelength fails to destroy the ITO electrode. This is considered to be due to attenuation of the energy of the laser beam of 355 nm wavelength as a result of absorption by the blue color filter. Thus, when the color filter is blue and a laser beam of 355 nm wavelength is used for destroying the ITO electrode, the laser energy density needs to be increased to greater than 0.25 J/cm$^2$.

These results suggest that appropriate selection of the laser beam's wavelength according to the color of color filter enables selective color filter ablation and ITO electrode destruction.

Example 2

Provision of Organic EL Device

Organic EL devices such as that illustrated in FIG. 8 are provided. In each organic EL device, pixel electrode 15, hole injection layer 17, hole transport layer 18, organic light-emitting layer 14, electron transport layer 19, and 100 nm-thick transparent counter electrode 13 (ITO electrode) are sequentially laminated on glass substrate 16. In this example, a color filter is not provided in the organic EL device.

Laser Irradiation

The transparent counter electrode of each of the organic EL devices provided above is irradiated with a laser beam of 1,064 nm wavelength at an energy density of 0.42 to 4.5 J/cm$^2$, a laser beam of 532 nm wavelength at an energy density of 0.06 to 0.71 J/cm$^2$, and a laser beam of 355 nm wavelength at an energy density of 0.05 to 0.41 J/cm$^2$. AGT-2000RT (YAG laser, manufactured by AGT Corporation) is employed as a laser device. The spot size of the laser beam on the transparent counter electrode is set to 20 μm, and pulse width is set to 3 to 5 ns. Laser irradiation is done in a single shot.

Results

Laser irradiations using 532 nm wavelength and 1,064 nm wavelength also damage the organic layer disposed under the transparent counter electrode (ITO electrode). On the other hand, laser irradiation using 355 nm wavelength destroys the transparent counter electrode, but does not damage the underlying organic layer. This indicates that in the case where a color filter is not present directly above the laser-irradiated portion of the transparent counter electrode, it is preferable to employ YAG laser with the third harmonics.

This application is entitled and claims the priority of Japanese Patent Application No. 2009-028435 filed on Feb. 10, 2009, the disclosure of which including the specification, drawings and abstract is incorporated herein by reference in its entirety.

INDUSTRIAL APPLICABILITY

With the manufacturing method of the present invention, a portion of a color filter directly above a defect is also ablated, whereby brightness reduction in the non-luminescent region (defect) can be prevented. It is thus possible to provide high-quality organic EL displays in high yields. In addition, the present invention can also be applied to the manufacture of other light-emitting devices having color filters.

REFERENCE SIGNS LIST

10 Sealing Glass
11 Color Filter
12 Protective Layer
13 Transparent Counter Electrode
14 Organic Layer
15 Pixel Electrode
16 Substrate
17 Hole Injection Layer
18 Hole Transport Layer
19 Electron Transport Layer
20 Glass Substrate
21 Foreign Material
31 Laser Source
32 Laser Beam
33 Slit Member
34 Focus Lens
35 Through-hole
36 Destroyed Portion of Transparent Counter Electrode
37 Thin Region of Color Filter
41 Gas Bubble
100 Organic EL Device
101 Defect
200 Laser Device

The invention claimed is:

1. A method of manufacturing an organic EL display, comprising:
providing an organic EL panel including a substrate and organic EL devices disposed over the substrate in a matrix arrangement, the organic EL devices each including a pixel electrode disposed over the substrate, an organic layer disposed over the pixel electrode, a transparent counter electrode disposed over the organic layer, a protective layer disposed over the transparent counter electrode, and a color filter disposed over the protective layer;
detecting a defect present in the organic layer of each of the organic EL devices;
destroying a portion of the transparent counter electrode directly above the defect by applying a laser beam to the portion through the color filter; and
removing a portion of the color filter directly above the defect such that beams of light diffused over the defect travel to outside through a portion from which the color filter has been removed, wherein the defect present in the organic layer remains in the organic layer of the organic EL display to be manufactured.

2. The manufacturing method according to claim 1, wherein the laser beam has a wavelength of 400 nm or less.

3. The manufacturing method according to claim 1, wherein the step of removing the color filter and the step of destroying the transparent counter electrode are the same step.

4. The manufacturing method according to claim 3, wherein the color filter to be removed is red, and the laser beam to be applied to the transparent counter electrode has a wavelength of less than 600 nm.

5. The manufacturing method according to claim 3, wherein the color filter to be removed is green, and the laser beam to be applied to the transparent counter electrode has a wavelength of less than 480 nm or between greater than 580 nm and less than 790 nm.

6. The manufacturing method according to claim 3, wherein the color filter to be removed is blue, and the laser beam to be applied to the transparent counter electrode has a wavelength of less than 430 nm or between greater than 500 nm and less than 850 nm.

7. The manufacturing method according to claim 1, wherein the step of removing the color filter and the step of destroying the transparent counter electrode are different steps, and the removal of the color filter is accomplished by applying a laser beam to a portion of the color filter directly above the defect.

8. The manufacturing method according to claim 7, wherein the color filter to be removed is red, and the laser beam to be applied to the transparent counter electrode has a wavelength of 600 nm or greater.

9. The manufacturing method according to claim 7, wherein the color filter to be removed is green, and the laser beam to be applied to the transparent counter electrode has a wavelength of between 480 nm and 580 nm or 790 nm or greater.

10. The manufacturing method according to claim 7, wherein the color filter to be removed is blue, and the laser beam to be applied to the transparent counter electrode has a wavelength of between 430 nm and 500 nm or 850 nm or greater.

11. The manufacturing method according to claim 1, wherein a through-hole is formed in the color filter in the step of removing the color filter.

12. The manufacturing method according to claim 1, wherein fine gas bubbles are formed in the protective layer by laser irradiation.

* * * * *